(12) United States Patent
Lee

(10) Patent No.: US 7,046,554 B2
(45) Date of Patent: May 16, 2006

(54) PAGE BUFFER OF FLASH MEMORY DEVICE AND DATA PROGRAM METHOD USING THE SAME

(75) Inventor: Ju Yeab Lee, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 11/009,749

(22) Filed: Dec. 10, 2004

(65) Prior Publication Data

US 2005/0265078 A1 Dec. 1, 2005

(30) Foreign Application Priority Data

May 28, 2004 (KR) .................. 10-2004-0038468

(51) Int. Cl.
*G11C 16/04* (2006.01)

(52) U.S. Cl. .................. 365/185.18; 365/185.17; 365/185.25; 365/185.33; 365/189.05

(58) Field of Classification Search ........... 365/185.18, 365/185.17, 185.25, 185.33, 230.08, 189.05
See application file for complete search history.

(56) References Cited

U.S. PATENT DOCUMENTS

| 6,813,184 B1 * | 11/2004 | Lee ..................... 365/185.09 |
| 2003/0117856 A1 * | 6/2003 | Lee et al. ............. 365/189.05 |
| 2004/0141402 A1 * | 7/2004 | Kim .................... 365/230.08 |

\* cited by examiner

*Primary Examiner*—Richard Elms
*Assistant Examiner*—Toan Le
(74) *Attorney, Agent, or Firm*—Marshall, Gerstein & Borun LLP

(57) ABSTRACT

Disclosed are a page buffer of a flash memory device and data program method using the same. After two data are sequentially stored in a main register (first latch) and a cache register (second latch) provided in a page buffer, they are respectively transferred to an even bit line and an odd bit line at the same time, and a bias needed for a program is applied to cells connected to the even bit line and the odd bit line, respectively, whereby the program is performed at the same time. Therefore, the number and time of operations for data loading, program operation and program verification can be reduced by half and the operating speed of the device can be improved.

6 Claims, 2 Drawing Sheets

PAGE BUFFER OF FLASH MEMORY DEVICE AND DATA PROGRAM METHOD USING THE SAME

This application relies for priority upon Korean Patent Application No. 2004-0038468 filed May 28, 2004, the contents of which are herein incorporated by reference in their entirety.

BACKGROUND

1. Field of the Invention

The present patent relates to a page buffer of a flash memory device and a data program method using the same, and more specifically, to a page buffer of a flash memory device in which a program speed can be improved and a data program method using the same.

2. Discussion of Related Art

In a NAND flash memory device, in order to program data, one data is loaded onto a page buffer and the loaded data is transferred to a bit line wherein an erased cell will be programmed. Thus, in the case where several pages are to be programmed, one data is loaded onto the page buffer, a cell is programmed according to the loaded data and the data is then stored. Next, in order to store data in a next page, data is loaded onto the page buffer and a cell is programmed.

Examples of the page buffer having this function are disclosed in U.S. Pat. No. 5,790,458 entitled "Sense Amplifier For Nonvolatile Semiconductor Memory Device", U.S. Pat. No. 5,761,132 "Integrated Circuit Memory Devices With Latch-Free Page Buffers Therein For Preventing Read Failures" and U.S. Pat. No. 5,712,818 entitled "Data Loading Circuit For Partial Program Of Nonvolatile Semiconductor Memory".

The conventional page buffer will now be described.

FIG. 1 is a circuit diagram showing a conventional page buffer.

Referring to FIG. 1, a page buffer circuit 10 is connected to a pair of bit lines BLe and BLo. A NMOS transistor M1 is connected between the bit line BLe and a sense node SO. The NMOS transistor M1 is controlled by a control signal BLSHFe. A NMOS transistor M2 is connected between the bit line BLo and the sense node SO. The NMOS transistor M2 is controlled by a control signal BLSHFo. A NMOS transistor M3 is connected between the bit line BLe and a control signal line VIRPWR. A NMOS transistor M4 is connected between the bit line BLo and the control signal line VIRPWR. The NMOS transistors M3 and M4 are controlled by control signals VBLe and VBLo, respectively. The aforementioned transistors M1 to M4 constitute a bit line select and bias circuit. The bit line select and bias circuit selects one of the bit lines BLe and BLo during program and read operations, connects the selected bit line to the sense node SO and floats the non-selected bit line.

A PMOS transistor M5 is connected between the power supply voltage VCC and the sense node SO. The transistor M5 is controlled by a control signal PLOAD. The page buffer circuit 10 includes a first latch LAT1 and a second latch LAT2. The first latch LAT1 consists of inverters INV1 and INV2 forming a latch and has first and second latch nodes B and /B. The second latch LAT2 consists of inverters INV3 and INV4 constituting a latch and has first and second latch nodes A and /A. A PMOS transistor M6 that is controlled by a control signal PBRST is connected between the power supply voltage VCC and the second latch node /B of the first latch LAT1. As the power supply voltage VCC is transferred according to the control signal PBRST, the first latch LAT1 is thus reset. NMOS transistors M7 and M8 are serially connected between the second latch node /B and the ground voltage VSS. The NMOS transistors M7 and M8 are controlled by a voltage level of the sense node SO and the control signal PBLCHM, respectively. In this time, the transistors M7 and M8 and the first latch LAT1 become a first latch circuit.

A PMOS transistor M9 is connected between the power supply voltage VCC and an nWDO terminal and is turned on/off according to a logical state of the first latch node B. The nWDO terminal is electrically connected to a pass/fail check circuit (not shown). A logical level of the nWDO terminal is complementary to the first latch node B. For example, if the first latch node B has a LOW level, the nWDO node is electrically connected to the power supply voltage VCC so that it has a HIGH level. If the first latch node B has a HIGH level, the nWDO node is electrically isolated from the power supply voltage VCC so that it is floated.

Meanwhile, a NMOS transistor M10 is turned on/off according to a control signal BLSLT and is connected between the sense node SO and the first latch node B of the first latch LAT1. A NMOS transistor M11 is connected between an internal node ND1 and the first latch node B. The transistor M11 is turned on/off according to a control signal PBDO. A PMOS transistor M12 is connected between the power supply voltage VCC and a first latch node A of the second latch LAT2 and is turned on/off according to a control signal PBSET. As the power supply voltage VCC is transferred to the second latch LAT2 according to the control signal PBSET, the second latch LAT2 is reset. A NMOS transistor M13 is connected between the first latch node A and the sense node SO and is controlled by a control signal PDUMP. NMOS transistors M14 and M15 are serially connected between the first latch node A and the ground voltage VSS. The NMOS transistor M14 is controlled according to a logical state of the sense node SO. The NMOS transistor M15 is controlled by a control signal PBLCHC. In this time, the transistors M14 and M15 and the second latch LAT2 become a second latch circuit.

A NMOS transistor M16 is connected between the second latch node /A of the second latch LAT2 and the internal node ND1. A NMOS transistor M17 is connected between the first latch node A of the second latch LAT2 and the internal node ND1. The NMOS transistors M16 and M17 are controlled by data signals D1 and nD1, respectively, which have a complementary level.

If a program data bit loaded onto the page buffer circuit 10 is '1', for example, the data signal D1 has a logical HIGH level and the data signal nD1 has a logical LOW level. The internal node ND1 is connected to a data line DL through the NMOS transistors M18 and M19 that constitute the column pass gate circuit. The NMOS transistors M18 and M19 are controlled by column select signals YA and YB, respectively. A NMOS transistor M20 is connected between the data line DL and the ground voltage VSS and the transistor M20 is turned on/off according to a control signal DL_DIS.

The flash memory device having the page buffer constructed above requires twice loading operations ad twice program operations in order to program two pages. The reason will be described in a more detailed manner as follows.

In the case of a prior art flash memory device, during a page program operation, data is loaded onto a main register (first latch), the transistors M10 and M1 are turned on by the control signals BLSLT and BLSHFe, data is located onto a bit line of a cell to be programmed, and the program operation is then performed by applying a bias needed for the program to the cell. Thereafter, in order to program a next page, the transistor M6 is turned on by the control signal PBRST and the main register (first latch) is thus reset. Next, new data is loaded onto the main register (first latch), the transistors M10 and M1 are turned on by the control signals BLSLT and BLSHFe, data is loaded onto a bit line of a cell to be programmed, and the program is then performed by applying a bias needed for the program to the cell.

In order to store data in two pages as such, twice loading operations and twice program operations are required. Thus, during the program operation, lots of time is consumed. Further, the program operation is not performed in 1 pulse, but must be carried out several times (usually 4 to 8 times) if failed cells occur through a program verification operation after the 1 pulse program operation. Therefore, there are problems in that lots of a program time is consumed and the operating speed of a device becomes thus low.

SUMMARY OF THE INVENTION

Accordingly, the present invention has been made in view of the above problems, and it is an object of the present invention to provide a page buffer of a flash memory device and a data program method using the same in which the number and time of operations for data loading, program and program verification can be reduced by half and the operating speed of the device can be improved, in such a manner that after two data are sequentially stored in a main register (first latch) and a cache register (second latch) provided in a page buffer, they are transferred to an even bit line and an odd bit line, respectively, at the same time, and a bias needed for a program is applied to cells connected to the even bit line and the odd bit line, respectively, to perform the program at the same time.

To achieve the above object, according to an embodiment of the present invention, there is provided a page buffer of a flash memory device, comprising a bias circuit that precharges an even bit line and an odd bit line and has first and second switching elements for selecting the bit lines, respectively, a first latch for storing an even data, a second latch for storing an odd data, a first switching element connected between the first switching element for selecting the even bit line and the first latch, wherein the first switching element transfers the even data to the even bit line according to a first data transfer control signal, and a second switching element connected between the second switching element for selecting the odd bit line and the second latch, wherein the second switching-element transfers the odd data to the odd bit line according to a second data transfer control signal, wherein the even data is transferred to the even bit line and the odd data is transferred to the odd bit line before a program operation so that a program of two pages can be performed through once program operation.

In the above, the page buffer may further comprise a third switching element that operates according to a first control signal and transfers the even data received from a data line to the first latch, and a fourth switching element that operates according to a second control signal and transfers the odd data received from the data line to the second latch.

Further, the page buffer may further comprise a fifth switching element connected to a power supply voltage terminal, wherein the fifth switching element transfers the power supply voltage to the first latch according to a third control signal to initially reset the first latch, and a sixth switching element connected to the power supply voltage terminal, wherein the sixth switching element transfers the power supply voltage to the second latch according to a fourth control signal to initially reset the second latch.

According to an embodiment of the present invention, there is provided a data program method of a flash memory device, comprising the steps of connecting a data line and a first latch to store an even data in the first latch, connecting the data line and a second latch to store an odd data in the second latch, connecting the first latch and an even bit line to transfer the even data to the even bit line, connecting the second latch and an odd bit line to transfer the odd data to the odd bit line, and storing the even data in a cell connected to the even bit line and at the same time storing the odd data in a cell connected to the odd bit line, through a program operation, whereby two pages are programmed through once program operation.

In the above, the data program method further comprises the step of precharging the even bit line and the odd bit line before the program is performed.

Further, the program operation is performed in a state where connection to the first latch is disconnected after the even data is transferred to the even bit line, and connection to the second latch is disconnected after the odd data is transferred to the odd bit line.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 1:
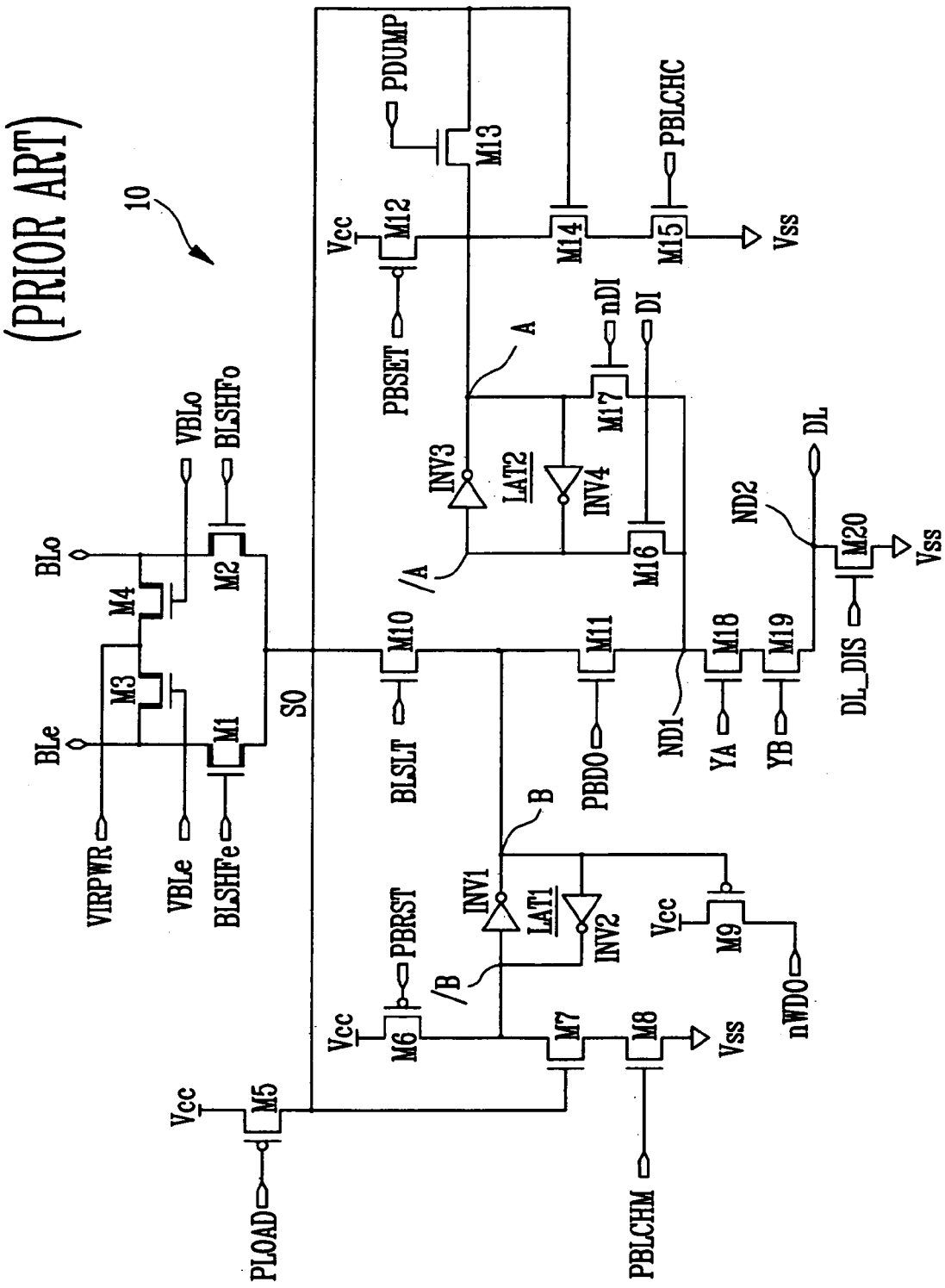
FIG. 1 is a circuit diagram showing a conventional page buffer.
Figure 2:
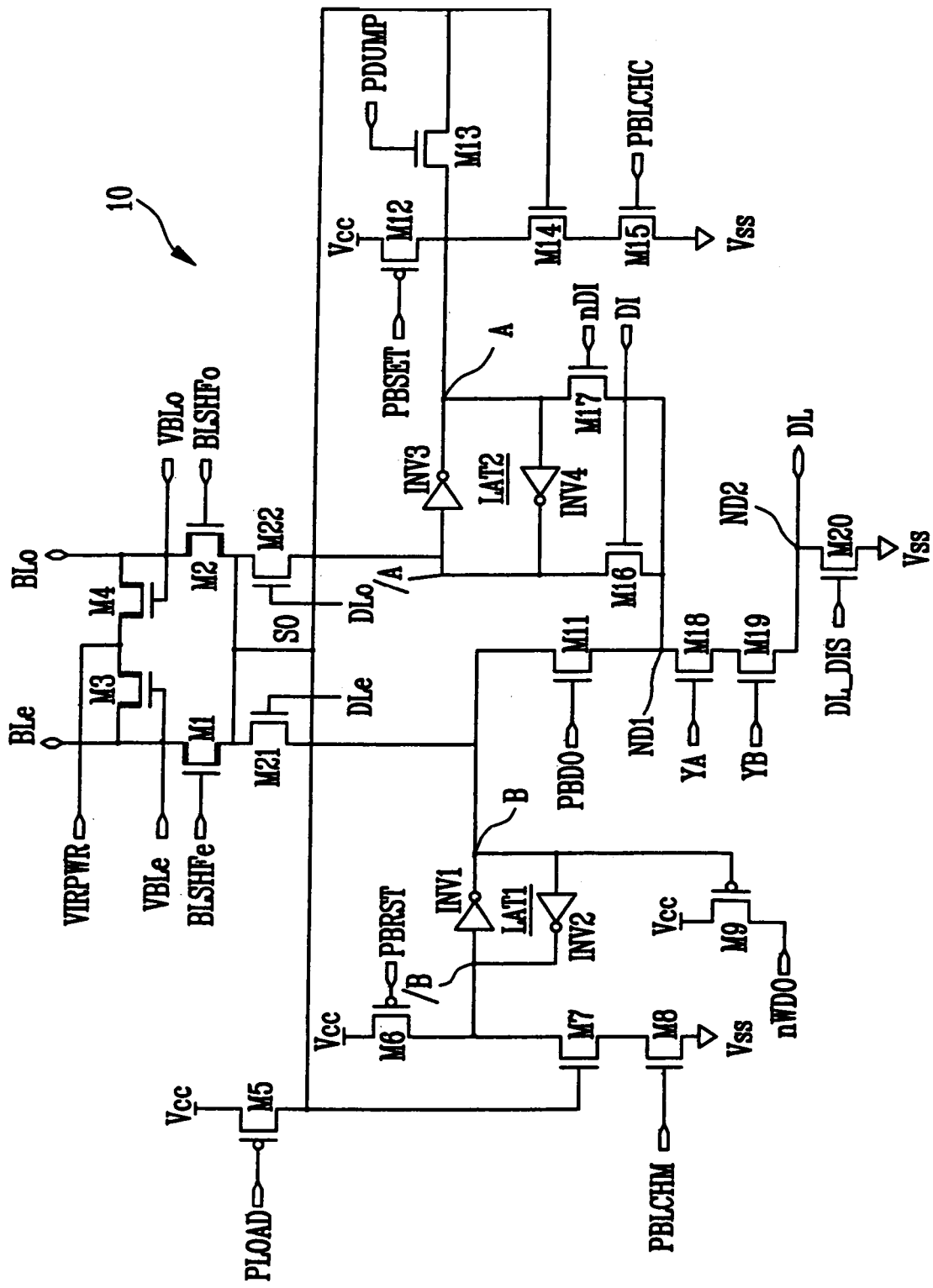
FIG. 2 is a circuit diagram showing a page buffer of a flash memory device according to an embodiment of the present invention.

FIG. 2 is a circuit diagram showing a page buffer of a flash memory device according to an embodiment of the present invention.

Referring to FIG. 2, the page buffer 10 of the flash memory device according to an embodiment of the present invention is connected to a pair of bit lines BLe and BLo. A NMOS transistor M1 is connected between the bit line BLe and a sense node SO. The NMOS transistor M1 is controlled by a control signal BLSHFe. A NMOS transistor M2 is connected between the bit line BLo and the sense node SO. The NMOS transistor M2 is controlled by a control signal BLSHFo. A NMOS transistor M3 is connected between the bit line BLe and a control signal line VIRPWR. A NMOS transistor M4 is connected between the bit line BLo and the control signal line VIRPWR. The NMOS transistors M3 and M4 are controlled by control signals VBLe and VBLo, respectively. The aforementioned transistors M1 to M4 constitute a bit line select and bias circuit. The bit line select and bias circuit selects one of the bit lines BLe and BLo during program and read operations, connects the selected bit line to the sense node SO and floats the non-selected bit line.

A PMOS transistor M5 is connected between the power supply voltage VCC and the sense node SO. The transistor M5 is controlled by a control signal PLOAD. The page buffer circuit 10 includes a first latch LAT1 and a second latch LAT2. The first latch LAT1 consists of inverters INV1 and INV2 forming a latch and has first and second latch nodes B and /B. The second latch LAT2 consists of inverters INV3 and INV4 constituting a latch and has first and second latch nodes A and /A. A PMOS transistor M6 for initializing the first latch LAT1 is connected between the power supply voltage VCC and the second latch node /B of the first latch LAT1. The transistor M6 is controlled by a control signal PBRST. NMOS transistors M7 and M8 are serially connected between the second latch node /B and the ground voltage VSS. The NMOS transistors M7 and M8 are controlled by a voltage level of the sense node SO and the control signal PBLCHM, respectively, so that data stored in a cell is stored in the first latch LAT1 during a read operation.

A PMOS transistor M9 is connected between the power supply voltage VCC and an nWDO terminal and is turned on/off according to a logical state of the first latch node B. The nWDO terminal is electrically connected to a pass/fail check circuit (not shown). A logical level of the nWDO terminal is complementary to the first latch node B. For example, if the first latch node B has a LOW level, the nWDO node is electrically connected to the power supply voltage VCC so that it has a HIGH level. If the first latch node B has a HIGH level, the nWDO node is electrically isolated from the power supply voltage VCC so that it has a floating state.

Meanwhile, a NMOS transistor M11 is connected between an internal node ND1 and the first latch node B. The transistor M11 is turned on/off according to a control signal PBDO.

A PMOS transistor M12 is connected between the power supply voltage VCC and the first latch node A of the second latch LAT2 and is turned on/off according to a control signal PBSET to initialize the second latch LAT2. The NMOS transistor M13 is connected between the first latch node A and the sense node SO and is controlled by a control signal PDUMP. NMOS transistors M14 and M15 are serially connected between the first latch node A and the ground voltage VSS. A NMOS transistor M14 is controlled according to a logical state of the sense node SO and a NMOS transistor M15 is controlled according to a control signal PBLCHC. Thus, upon read operation, data stored in a cell is stored in the second latch LAT2.

A NMOS transistor M16 is connected between the second latch node /A of the second latch LAT2 and the internal node ND1. A NMOS transistor Ml7 is connected between the first latch node A of the second latch LAT2 and the internal node ND1. The NMOS transistors M16 and M17 are respectively controlled by data signals D1 and nD1 having a complementary level.

If a program data bit loaded onto the page buffer circuit 10 is '1', for example, the data signal D1 has a logical HIGH level and the data signal nD1 has a logical LOW level. The internal node ND1 is connected to a data line DL through the NMOS transistors M18 and M19 that constitute the column pass gate circuit. The NMOS transistors M18 and M19 are controlled by column select signals YA and YB, respectively. A NMOS transistor M20 is connected between the data line DL and the ground voltage VSS and the transistor M20 is turned on/off according to a control signal DL_DIS.

Further, a NMOS transistor M21 is connected between the first latch node B of the first latch LAT1 and the sense node SO. The transistor M21 is turned on/off according to a first data transfer control signal DLe. A NMOS transistor M22 is connected between the second latch node /A of the second latch LAT2 and the sense node SO and is turned on/off according to a second data transfer control signal DLo.

In the above, the first latch LAT1 latches data that will be stored in a cell connected to the even bit line BLe. If the transistors M21 and M1 are turned on by the first data transfer control signal DLe and the control signal BLSHFe, the latched data is transferred to the even bit line BLe. Also, the second latch LAT2 latches data that will be stored in a cell connected to the odd bit line BLo. If the transistors M22 and M2 are turned on by the second data transfer control signal DLo and the control signal BLSHFo, the latched data is transferred to the odd bit line BLo. As such, two data to be programmed are latched in the first latch LAT1 and the second latch LAT2, respectively, and are then transferred to the even bit line BLe and the odd bit line BLo, respectively. As such, the data are programmed in the cell connected to the even bit line BLe and in the cell connected to the odd bit line BLo at the same time through once program operation.

A data program method using the page buffer constructed above will now be described in detail.

The transistors M3 and M4 of the bias circuit are first turned on by the control signals VBLe and VBLo to charge the even bit line BLe and the odd bit line BLo.

The transistor M11 is then turned on by the control signal PBDO to store an even data that will be transferred to the even bit line BLe in the first latch LAT1. After the transistor M11 is turned off by the control signal PBDO; the transistor M16 is turned on by the control signal DI to store an odd data that will be transferred to the odd bit line BLo in the second latch LAT2.

After the two data are stored in the first latch LAT1 and the second latch LAT2 respectively, the transistor M21 and the transistor M1 are turned on by the first data transfer control signal DLe and the control signal BLSHFe, respectively, to transfer the even data stored in the first latch LAT1 to the even bit line BLe. If the even data is transferred to the even bit line BLe, the transistor M21 and the transistor M1 are respectively turned off by the first data transfer control signal DLe and the control signal BLSHFe. Thereafter, the transistor M22 and the transistor M2 are turned on by the second data transfer control signal DLo and the control signal BLSHFo, respectively, to transfer the odd data stored in the second latch LAT2 to the odd bit line BLo. If the odd data is transferred to the odd bit line BLo, the transistor M22 and the transistor M2 are turned off by the second data transfer control signal DLo and the control signal BLSHFo.

If the even data and the odd data are respectively transferred to the even bit line BLe and the odd bit line BLo, a program operation is performed to store the even data in a cell connected to the even bit line BLe and the odd data in a cell connected to the odd bit line BLo.

Thereafter, a program verification operation and a program re-execution operation are performed in the same manner as the common operation. Through the above operation, a program of two pages is completed through once program operation.

As described above, according to the present invention, after two data are sequentially stored in a main register (first latch) and a cache register (second latch) provided in a page buffer, they are respectively transferred to an even bit line and an odd bit line at the same time, and a bias needed for a program is applied to cells connected to the even bit line and the odd bit line, respectively, whereby the program is performed at the same time. Therefore, the present invention has effects that the number and time of operations for data loading, program operation and program verification can be reduced by half and the operating speed of the device can be thus improved.

What is claimed is:

1. A page buffer of a flash memory device, comprising:
   a bias circuit that precharges an even bit line and an odd bit line and has first and second switching elements for selecting the bit lines, respectively;
   a first latch for storing an even data;
   a second latch for storing an odd data;
   a first switching element connected between the first switching element for selecting the even bit line and the first latch, wherein the first switching element transfers the even data to the even bit line according to a first data transfer control signal; and
   a second switching element connected between the second switching element for selecting the odd bit line and the second latch, wherein the second switching element transfers the odd data to the odd bit line according to a second data transfer control signal,
   wherein the even data is transferred to the even bit line and the odd data is transferred to the odd bit line before a program operation so that a program of two pages can be performed through once program operation.

2. The page buffer according to claim 1, further comprising:
   a third switching element that operates according to a first control signal and transfers the even data received from a data line to the first latch; and
   a fourth switching element that operates according to a second control signal and transfers the odd data received from the data line to the second latch.

3. The page buffer according to claim 1, further comprising:
   a fifth switching element connected to a power supply voltage terminal, wherein the fifth switching element transfers the power supply voltage to the first latch according to a third control signal to initially reset the first latch; and
   a sixth switching element connected to the power supply voltage terminal, wherein the sixth switching element transfers the power supply voltage to the second latch according to a fourth control signal to initially reset the second latch.

4. A data program method of a flash memory device, comprising the steps of:
   connecting a data line and a first latch to store an even data in the first latch;
   connecting the data line and a second latch to store an odd data in the second latch;
   connecting the first latch and an even bit line to transfer the even data to the even bit line;
   connecting the second latch and an odd bit line to transfer the odd data to the odd bit line; and
   storing the even data in a cell connected to the even bit line and at the same time storing the odd data in a cell connected to the odd bit line, through a program operation, whereby two pages are programmed through once program operation.

5. The data program method according to claim 4, further comprising the step of precharging the even bit line and the odd bit line before the program is performed.

6. The data program method according to claim 4, wherein the program operation is performed in a state where connection to the first latch is disconnected after the even data is transferred to the even bit line, and connection to the second latch is disconnected after the odd data is transferred to the odd bit line.

* * * * *

UNITED STATES PATENT AND TRADEMARK OFFICE
CERTIFICATE OF CORRECTION

PATENT NO. : 7,046,554 B2 Page 1 of 1
APPLICATION NO. : 11/009749
DATED : May 16, 2006
INVENTOR(S) : Ju Y. Lee It is certified that error appears in the above-identified patent and that said Letters Patent is hereby corrected as shown below:

In the Claims:

Column 7, line 24, "once" should be -- one --.

Column 8, line 24, "once" should be -- one --.

Signed and Sealed this

First Day of May, 2007

JON W. DUDAS
*Director of the United States Patent and Trademark Office*